United States Patent [19]

Segawa

[11] Patent Number: 4,763,041
[45] Date of Patent: Aug. 9, 1988

[54] DOT ARRAY FLUORESCENT TUBE FOR WRITING OPTICAL INFORMATION IN OPTICAL PRINTER

[75] Inventor: Hideo Segawa, Tokyo, Japan

[73] Assignee: Ricoh Company, Ltd., Tokyo, Japan

[21] Appl. No.: 663,440

[22] Filed: Oct. 22, 1984

[30] Foreign Application Priority Data

| Oct. 24, 1983 | [JP] | Japan | 58-199449 |
| Oct. 26, 1983 | [JP] | Japan | 58-200550 |
| Nov. 17, 1983 | [JP] | Japan | 58-217507 |
| Nov. 17, 1983 | [JP] | Japan | 58-217508 |

[51] Int. Cl.⁴ .................. H01J 1/46; G03B 27/54; G01D 15/14
[52] U.S. Cl. .................. 313/496; 313/497; 340/815.2; 355/67; 346/161
[58] Field of Search .......... 313/495, 496, 497, 295; 340/815.2; 355/67, 68; 346/161

[56] References Cited

U.S. PATENT DOCUMENTS

| 2,639,398 | 5/1953 | Jacobi et al. | 313/295 X |
| 3,977,176 | 8/1976 | Murakami et al. | 340/815.2 X |
| 4,156,239 | 5/1979 | Hirano et al. | 313/496 X |
| 4,263,001 | 4/1981 | Deutsch | 355/67 X |
| 4,383,758 | 5/1983 | Honda et al. | 355/68 |
| 4,455,774 | 6/1984 | Watanabe | 313/496 X |
| 4,551,737 | 11/1985 | Inokuchi | 313/496 X |

FOREIGN PATENT DOCUMENTS 59-46742  3/1984  Japan ................... 313/496

Primary Examiner—Leo H. Boudreau
Assistant Examiner—Sandra L. O'Shea
Attorney, Agent, or Firm—Cooper, Dunham, Griffin & Moran

[57] ABSTRACT

A dot array fluorescent tube for an optical printer writes optical information on a photoconductive element by converting an information signal representative of a desired image to optical information. A grid electrode disposed in a vacuum space defined in a housing has a slot-like opening in a portion thereof which faces an array of fluorescent elements which are formed on anodes, which are also arranged in an array in the lengthwise direction of the housing. The grid electrode is formed as a metal film on the housing through an insulating layer. A conductive light intercepting film is deposited on the housing except for a limited portion which faces the fluorescent element array, thereby regulating the direction of light which is transmitted through the housing. The fluorescent elements in the array provide a plurality of dot arrays which are controlled independently of each other. Lead terminals are connected with the anodes and led out to the outside of the housing to be connected to external drive devices by an anisotropic conductive rubber connector. The lead terminals are divided into groups each made up of a predetermined number.

11 Claims, 8 Drawing Sheets

FIG. 9A  FIG. 9B
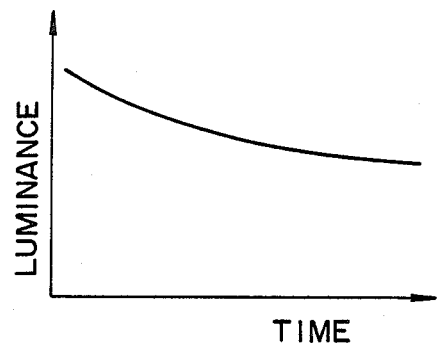
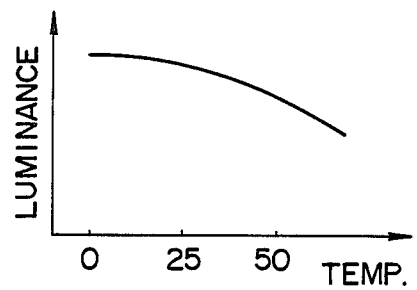
FIG. 10
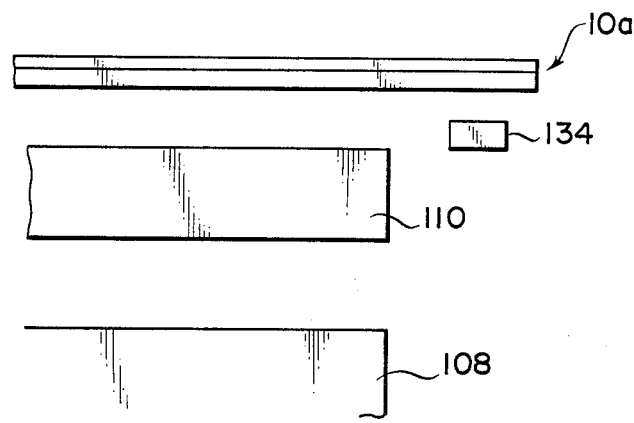

DOT ARRAY FLUORESCENT TUBE FOR WRITING OPTICAL INFORMATION IN OPTICAL PRINTER

BACKGROUND OF THE INVENTION

The present invention relates to an optical printer which writes an information signal representative of an image to be recorded into a photoconductive element by converting the signal to optical information and, more particularly, to an optical information writing dot array fluorescent tube adapted to transform the information signal into optical information.

Optical printers may generally be classified into two types, i.e., a type which raster scans optical dots to project them to a photoconductive element such as a laser type system and an OFT type system, and a type which projects an array of optical dots corresponding to one line onto a photoconductive element such as a light emitting element (LED) type system, a fluorescent tube type system and a liquid crystal type system. The type to which the present invention constitutes an improvement is the second-mentioned dot array type optical printer.

An optical printer of the type with which the present invention concerned includes a dot array fluorescent tube for transforming an information signal into optical information. The fluorescent tube compises a single array of small fluorescent elements each being formed on an anode, and cathode filaments. The arrangement is such that thermoelectrons liberated from the cathode filaments impinge on those fluorescent elements which are selected in response to an information signal, so that the selected fluorescent elements emit light to thereby convert the information signal to optical information. The respect anodes are connected to external drive control devices in order to electrically control their associated fluorescent elements independently of each other and on-off control them by means of information signals (print information signal and others). In this kind of fluorescent tube, a grid electrode is positioned between the cathode filaments and the fluorescent element array so as to effectively conduct the thermoelectrons released from the cathode filaments onto the fluorescent elements. That is, the grid electrode serves as a kind of electronic lens for effectively directing the thermoelectrons toward the fluorescent elements.

In detail, the dot array fluorescent tube usually includes a glass or ceramic substrate on which a plurality of anodes are formed by photoetching, for example, in such a manner as to represent discrete dots such as in a staggered configuration. Each of the anodes carries thereon a fluorescent element which is formed by photoetching, for example, in a size which is 50–60 microns each side in corresponence with a small dot for printing. Usually, the fluorescent elements are made of ZnO:Zn and applied to the respective anodes by electrodeposition or a so-called exposure process which uses photoresist as a binder. The anodes are covered with insulating layers (insulative paste layers) except for their portions where the fluorescent elements are located. A grid electrode is provided on the insulating layers. Having a mesh structure, the grid electrode is so arranged as to cover the anodes carrying the fluorescent elements thereon from above. Two cathode filaments each comprising a thin line coated with an oxide are stretched in a vacuum space above the grid electrode and adapted to liberate the previously mentioned thermoelectrons. The vacuum chamber is hermetically closed by a substrate and a face glass.

The problem encountered with such a prior art dot array fluorescent tube is that since the grid electrode covers the fluorescent element array from above, optical information to be written in a photoconductive element is partly intercepted by the grid electrode, resulting in waste of radiations and irregular radiations.

Meanwhile, it is a prerequisite in the prior art fluorescent tube discussed above that the grid electrode be positioned with accuracy on opposite sides of the minute dot pattern so as to allow the fluorescent elements on the anodes to be stimulated by thermoelectrons from the cathode filaments and, thereby, cause a current to flow through the numerous dots in an even density. In practice, the grid electrode is bonded to a metal sheet by a glass paste having a low melting point. However, whatever the accuracy of the grid position may be, a heating step which is performed after the mounting of the grid electrode for fusing low melting point glass causes the grid electrode to be distorted and, as a result, to be bent or warped. The distortion introduces irregularity locally in the flow of the thermoelectrons and, thereby, irregularity in the luminance of radiation from the dot array.

Further, when light is issuing from the fluorescent elements of the prior art fluorescent tube is to be focused by an imaging element of the optical printer onto the photoconductive element, the light transmitted through the face glass partly misses the imaging element and propagates the outside thereof to provide a flare component. The flare component reaching the photoconductive element has adverse influence on a projected image, thereby lowering the recording quality.

In an optical printer with the prior art dot array fluorescent tube discussed above, assuming that requiring exposure energy on the photocondutive element is 10 erg/cm$^2$, a printing rate of, for example, ten copies per second has to be implemented by a luminance of light issuing from the fluorescent elements which is as high as 7,000–10,000 fL (on the assumption that the fluorescent elements are made of AnO : Zn and the light utilization efficiency of the imaging element is 5%). This means the need for a radiation capability with a considerable luminance in view of the fact that the luminance ordinarily required for display applications is about 200–1,000 fL. Assuming that each fluorescent element is sized 50 by 50 microns, the luminance of 10,000 causes a current of about 10 microamperes to flow into the element resulting in a substantial current density in the anode. Should the fluorescent elements be used in such a situation, the luminance would be lowered (deteriorated) by aging.

Meanwhile, the anodes of the prior art dot array fluorescent tube are led out to the outside of the face glass in order to be connected with external drive control devices such as integrated circuit (IC) chips. Specifically, it is necessary to control the drive of the anodes by connecting them in one-to-one correspondence with electrodes on an IC substrate which are led out from IC chips. The problem encountered here is that since the pitch of the anode arrangement is small and, in addition, the required length of connection is large, a pitch error is liable to develop between the electrodes on the IC substrate and the anodes on the fluorescent tube substrate. Total pitch error throughout the length of a flexible tape or a printed circuit board, on which the ICs are mounted, a substantial and prevents the connection from being accomplished in a desirable condition. A possible practical approach for the connection is thermocompression bonding. However, where the substrate of the fluorescent tube is made of glass, such an approach is undesirable because it often produces cracks in the substrate or even breaks it during the process. A failure of the fluorescent tube has to be repaired by replacing not only the tube but also the whole, comparatively expensive IC substrate.

SUMMARY OF THE INVENTION

It is therefore a first object of the present invention to provide a new dot array fluorescent tube for writing optical information which eliminates waste of radiations as well as irregular radiations and, thereby, contributes to an improvement in recording quality.

It is a second object of the present invention to provide a dot array fluorescent tube for writing optical information which improves recording quality by establishing an even luminance distribution of light issuing from an array of fluorescent dot array.

It is a third object of the present invention to provide a dot array fluorescent tube for writing optical information which improves recording quality by removing flare components of light.

It is a fourth object of the present invention to provide a dot array fluorescent tube for writing optical information which achieves a longer service life despite the need for high luminance radiations.

It is a fifth object of the present invention to provide a dot array fluorescent tube for writing information which promotes easy and sure interconnection between electrodes associated with a substrate of the fluorescent tube and those associated with ICs on an IC substrate, on which drive control devices are mounted.

It is another object of the present invention to provide a generally improved dot fluorescent tube for writing information in an optical printer.

A dot array fluorescent tube for writing optical information which converts an information signal representative of an image to be recorded to optical information of the present invention comprises a housing including an elongate transparent portion extending in a lengthwise direction of said housing, the elongate portion defining a vacuum space extending in the lengthwise direction, cathodes extending in the lengthwise direction in the vacuum space, anodes arranged in an array at a predetermined spacing in the lengthwise direction and in a position to face the transparent portion of the housing, fluorescent elements provided on the respective anodes in an array, and a grid electrode extending in the lengthwise direction between the cathodes and the array of the fluorescent elements, the grid electrode being removed in a portion thereof which faces the array of the fluorescent elements to form an opening.

In accordance with the present invention, a dot array fluorescent tube for an optical printer writes optical information on a photoconductive element by converting an information signal representative of a desired image to optical information. A grid electride disposed in a vacuum space defined in a housing has a slot-like opening in a portion thereof which faces an array of fluorescent elements which are formed on anodes, which are also arranged in an array in the lengthwise direction of the housing. The grid electrode is formed as a metal film on the housing through an insulating layer. A conductive light intercepting film is deposited on the housing except for a limited portion which faces the fluorescent element array, thereby regulating the direction of light which is transmitted through the housing. The fluorescent elements in the array provide a plurality of dot arrays which are controlled independently of each other. Lead terminals are connected with the anodes and led out to the outside of the housing to be connected to external drive devices by an anisotropic conductive rubber connector. The lead terminals are divided into groups by each predetermined number.

The above and other objects, features and advantages of the present invention will become more apparent from the following description taken with the accompanying drawings.

BRIEF DESCRIPTION OF THE DRAWINGS

FIGS. 9A and 9B and 10 are views illustrative of a problem encountered with the optical printer shown in FIG. 6 and a solution to the problem;

FIGS. 15–20 are views showing another embodiment of the present invention.

DESCRIPTION OF THE PREFERRED EMBODIMENTS

While the dot array fluorescent tube for writing optical information in an optical printer of the present invention is susceptible of numerous physical embodiments, depending upon the environment and requirements of use, substantial numbers of the herein shown and described embodiments have been made, tested and used, and all have performed in an eminently satisfactory manner.

Figure 1:
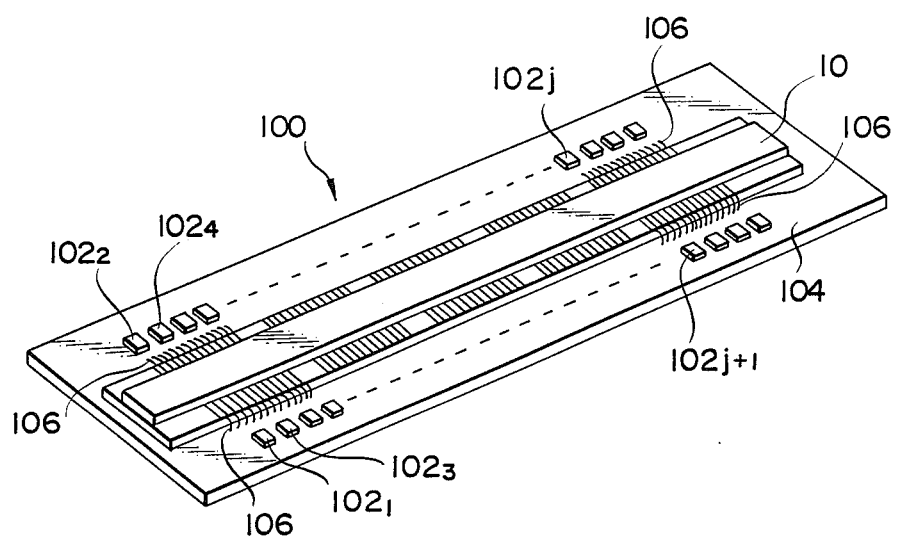
FIG. 1 is a perspective view of an optical information writing device using a dot array fluorescent tube embodying the present invention.

Referring to FIG. 1 of the drawings, an optical information writing device 100 with a dot array fluorescent tube 10 in accordance with the present invention is shown. IC chips $102_1$, $102_2$, $102_3$, . . ., $102_j$, . . . are adapted to drive the fluorescent tube 10 and are mounted on a substrate 104 together with the fluorescent tube 10. While various materials such as glass and resin are available for the substrate 104, ceramic is desirable and it is used in the illustrative embodiment. Bonding wires 106 each connect anode lead terminals of the fluorescent tube 10 and drive terminals of the IC chips $102_j$. For the connection of the anode lead terminals and the drive terminals, use may be made of a thermocompression bonding flexible tape which is known in relation with connections of light emitting diode (LED) arrays.

Figure 2:
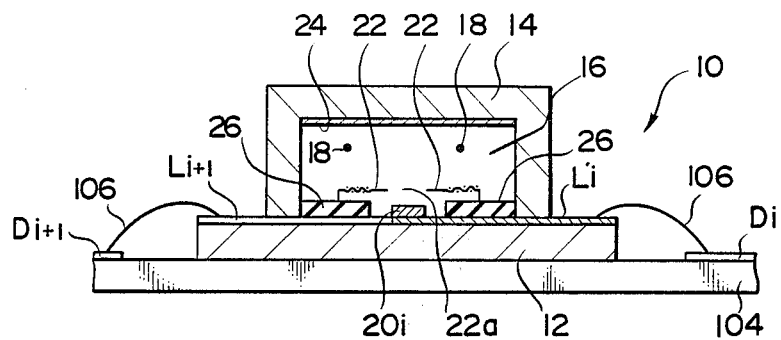
FIGS. 2 and 3 are views of the fluorescent tube shown in FIG. 1.

As shown in FIG. 2, the fluorescent tube 10 comprises a substrate glass 12 and a face glass 14 which cooperate to define a rectangular parallelepiped vacuum chamber 16, which is long in a direction perpendicular to the sheet surface of FIG. 2. Disposed in the hermetic vacuum chamber 16 are cathode filaments 18, fluorescent elements $20_i$, a grid electrode 22, etc. A transparent electrode 24 is carried on the inner surface of the face glass 14. The reference numeral 26 designates insulation layers. Labelled $L_i$ and $L_i+1$ are anode lead terminals associated with anodes, while labelled $D_i$ and $D_i+1$ are drive terminals connected with the anode lead terminals $L_i$ and $L_i+1$, respectively.

Figure 3:
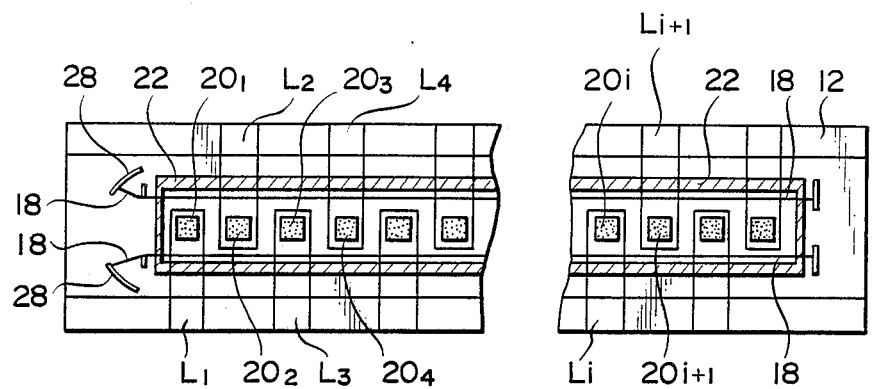

As shown in FIG. 3, anode lead terminals $L_1$, $L_2$, $L_3$, ..., $L_i$, $L_{i+1}$ are mounted on the substrate glass 12 and arranged one after in the lengthwise direction of the vacuum chamber 16 (right-and-left direction in FIG. 3) while being alternately led out to the right and left. The tips of the anode lead terminals each serve as anodes on which fluorescent elements $20_1$, $20_2$, $20_3$, ..., $20_i$, $20_{i+1}$, ... respectively are formed. Each of the fluorescent elements $20i$ is very small and fulfills the role of an optical dot independently of the others when stimulated as will be described. The fluorescent elements 20i are arranged in a single array extending in the lengthwise direction of the vaccum chamber 16. Cathode filaments 18 are stretched tightly by resilient plates 28 in the lengthwise direction of the vacuum chamber 16.

Figure 4:
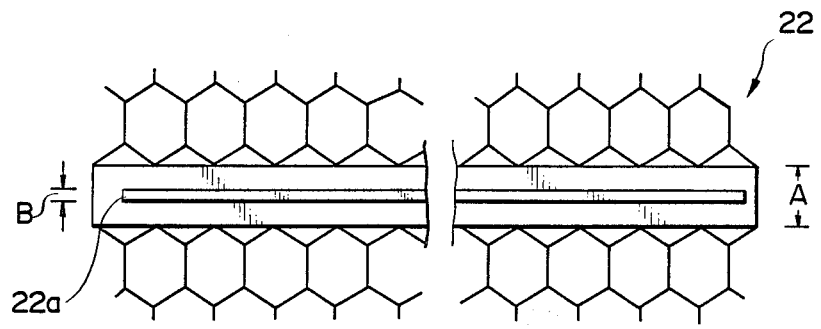
FIG. 4 is a view of a grid electrode configuration included in the fluorescent tube of FIGS. 2 and 3.

The grid electrode 22 is supported by the insulation layers 26 and interposed between the cathode filaments 18 and the array of the fluorescent elements $20_i$. As shown in FIG. 2, the grid electrode 22 is provided with a slot 22a which extends along the length of the vacuum chamber 16 and in alignment with and just above the array of the fluorescent elements $20_i$. As shown in FIG. 4, the grid electrode 22 comprises an elongate plate-like portion, where the slot 22a is positioned, and a meshed portion made up of meshes each having a turtle-shell shape. The plate-like portion has a width A of about 500 microns and the slot 22a, a width of about 150 microns. Naturally, the slot 22a extends over a length which is greater than the length of the array of the fluorescent elements $20_i$.

Referring again to FIG. 1, the IC chips $102j$ are adapted to drive the fluorescent tube 10 as previously mentioned. Such will be discussed in more detail with reference to FIG. 3 as well. In FIG. 1, those IC chips $102_1$, $102_3$, ..., $102_{j+1}$, ... which are located at one side with respect to the fluorescent tube 10 serve to drive odd-numbered fluorescent elements $20_1$, $20_3$, $20_5$, ... shown in FIG. 3, while those IC chips $102_2$, $102_4$, ... $102_j$, ... which are located at the other side serve to drive even-numbered fluorescent elements $20_2$, $20_4$, $20_6$, ...

Figure 5:
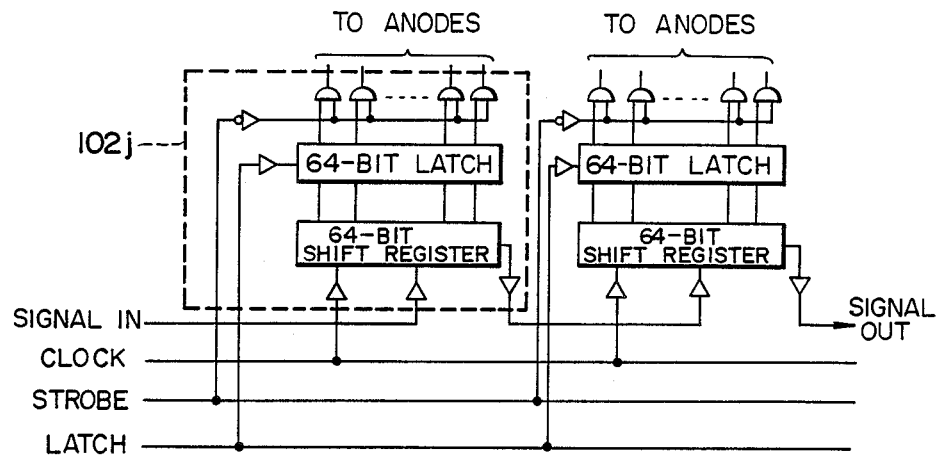
FIG. 5 is a circuit diagram representative of exemplary IC chips adapted to drive the fluorescent tube.

Referring to FIG. 5, an example of a circuitry of the IC chips $102_j$ is shown. A single IC chip is indicated by the phantom line. The IC chip comprises a 64-bit shift register and a 64-bit latch circuit and, therefore, assigned to 64 fluorescent elements $20_i$. Assuming that one line of information signal comprises 2,560 bits, for example, the total number of the fluorescent elements $20_i$ is also 2,560. The 2,560 bits signal is divided with respect to odd bits and even bits as will be referred to as an odd bit stream signal and an even bit stream signal hereinafter. The odd bit stream signal is applied to the anodes of the odd fluorescent elements $20_1$, $20_3$, $20_5$... by the anode lead terminals $L_1$, $L_3$, $L_5$..., while the even bit stream is applied to the anodes of the even fluorescent elements $20_2$, $20_4$, $20_6$... by the anode lead terminals $L_2$, $L_4$, $L_6$...

Describing the application of the even bit stream signal, for example, with reference to FIGS. 1 and 5, the even bit stream signal comes in the shift register of the IC chip $102_1$, then leaves it through an output terminal, then enters the next IC chip $102_3$ and, thereafter, repeats the same procedure until all the 1,280 bits of signal have been held by the shift registers of the IC chips $102_1$, $102_3$, $102_5$, ... sixty-four bits each. Then, the signals are shifted to their associated latch circuits in reponse to a latch signal. Thereafter, in response to a strobe signal, a drive voltage is applied to each odd anode as represented by an information signal. Such a principle also applies to the application of the even bit stream signal.

The operation of the dot array fluorescent tube 10 will be described with reference to FIG. 2. When an AC voltage of 10–20 volts is applied to the cathode filaments 18 with the transparent electrode 24 connected to ground, the current heats the cathode filaments 18 so that the latter liberates thermoelectrons. In this condition, most of the liberated thermoelectrons tend to be absorbed by the transparent electrode 24. However, a positive voltage of about 40 volts is applied to the anode at the tip of a certain anode lead terminal such as $L_i$, it causes the thermoelectrons to be pulled toward the anode until they impinge on the fluorescent element $20_i$ associated with the anode. As a result, the fluorsecent element $20_i$ is stimulated to emit a radiation having a spectrum particular to the composition of the fluorescent material. The grid electrode 22 serves to effectively conduct the thermoelectrons onto the fluorescent body as an electronic lens as previously described. A positive voltage of 15–20 volts is applied to the grid electrode 22.

As already mentioned, a drive voltage is delivered to the anodes in response to an information signal and, hence, the fluorescent elements can be stimulated as represented by the information signal so as to transform the signal into one line of optical information.

Figure 6:
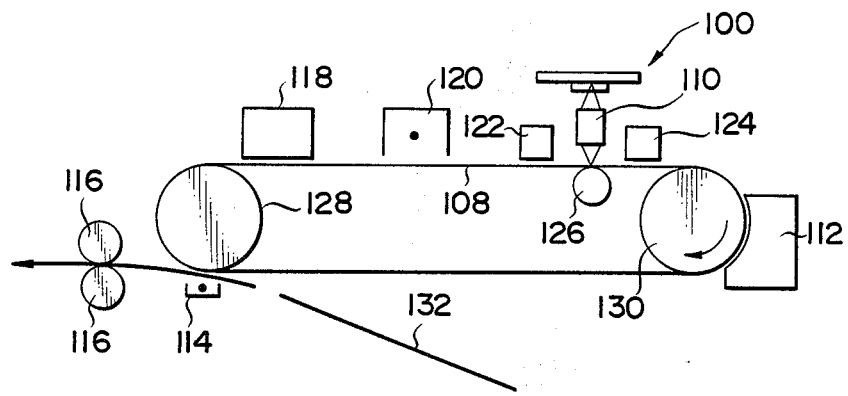
FIG. 6 is a front view of an optical printer to which the fluorescent tube is applicable.

Referring to FIG. 6, there is shown in a fragmentary schematic view an exemplary optical printer using the optical information writing device 100 in which the dot array fluorescent tube 10 of the present invention is built in. The printer includes the device 100 shown in FIG. 1, a photoconductive element 108, a converging light transmitted array 110 functioning as an equimagnification imaging element, a developing unit 112, a transfer unit 114, a fixing unit 116, a cleaning unit 118, a charger 120, brushes 122 and 124, and a roller 126. The photoconductive element 108 is in the form of an endless belt and passed over pulleys 128 and 130 to be rotatable clockwise in the drawing.

The converging light transmitter array 110 is interposed between the device 100 and the photoconductive element 108 to connect the fluorescent element array of the device 100 and the photoconductive element 108 in an imaging relation. In this construction, when one line of optical information is developed in the device 100 in the manner described, the optical information is imaged by the array 110 in an equimagnification, non-inverted image on the photoconductive element 108. The roler 126 abuts against the inntrer surface of the photoconductive element 108 in a position just below the array 110 so as to keep the element 108 in alignment with the imaging surface of the array 110. The brushes 122 and 124 function to prevent toner particles from depositing on the light transmitter array 110. The convering light transmitter array, which serves as an equimagnification imaging element, may be replaced by a Dach mirror lens array.

In operation, the photoconductive element 108 is moved clockwise in FIG. 6 and, first, uniformly charged by the charger 120 over its periphery. As soon as the uniformly charged peripheral area of the element 108 reaches a position just below the light transmitter array 110, the information signal associated with an image to be recorded is applied to the writing device 100, then transformed by the fluorescent tube 1 into optical information, and then projected onto the photoconductive element 108 so that the information is written line by line on the element 108. A latent image electrostatically formed on the element 108 in response the information signal is developed by the developing unit 112. The resulting toner image is transferred to a recording sheet 132 by the transfer unit 114 and, then, fixed thereon by the fixing unit 116. The photosensitive element 108 after the image transfer is cleaned by the cleaning unit 118, that is, residual toner is removed from the element 108.

Figure 7:
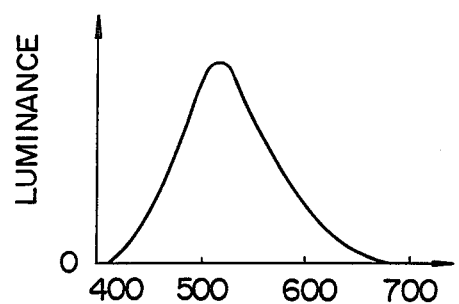
FIGS. 7 and 8 are views illustrative of characteristics of the optical printer shown in FIG. 7.
Figure 8:
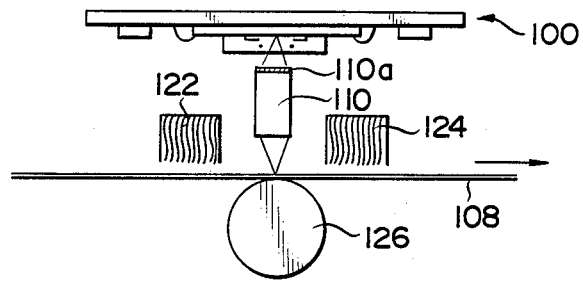

As previously described, the radiation from the fluorescent tube 10 is caused by hitting the fluorescent elements with thermoelectrons and the radiation spectrum depends upon the composition of the fluorescent element. The radiation spectrum of such a fluorescent element is generally distributed over a wide frequency range. Where it is made of ZnO:Zn, for example, the spectrum distribution of luminances substantially covers the whole visible range, as shown in FIG. 7. Due to such a wide frequency range, the light issuing from the fluorescent element would entail chromatic aberration in the equimagnification imaging element and, thereby, limit the attainable resolution in the recorded image. To solve this problem, the optical printer shown in FIG. 6 employs a multilayer interference filter 110a as shown in FIG. 8. The filter 110a is mounted on one end of the light transmitter array 110 (in this particular embodiment, an end adjacent to the writing device 100) and serves to cut off light on the long and short wavelength sides which constitutes a source of chromatic aberration, thereby reducing the influence of chromatic aberration. In the case where the equimagnification element is implemented by a Dach mirror lens array, it is reasonable to mount a multilayer interference filter on a light inlet or outlet end glass.

As shown in FIG. 9A, the luminance of the radiation from a fluorescent element tends to decrease with time. In addition, as shown in FIG. 9B, it is effected by the ambient temperature. The density of recorded images thus can changed with time and/or due to fluctuation of ambient temperature. An implementation for eliminating such an occurrence is shown in FIG. 10. In FIG. 10, a dot array fluorescent tube 10a is shown in which the array of fluorescent elements extends beyond the writing line length, while a photosensor 134 is positioned in the neighborhood of that part of the fluorescent element array which does not join in recording. The photosensor 134 senses a radiation intensity from the fluorescent elements so that the drive voltage applied to the fluorescent tube 10a may be controlled in such a manner as to maintain an output of the photosensor 134 constant.

As described above, the dot array fluorescent tube 10 in accordance with the present invention frees the printer from waste of radiations or irregular radiations and, thereby, accomplishes the prviously stated first object of the present invention. This is because the grid electrode 22 interposed between the cathode filaments 18 and the array of the fluorescent elements $20_i$ is provided with the slot 22a which is aligned with the array of the fluorescent elements $20_i$.

Meanwhile, the grid electrode may be formed on the insulation layers as a metal film by direct evaporation, sputtering, or printing so that it attains an improved precision in position and is freed from distortion. Such is successfull in uniformalizing the luminance of radiation from the dot array and, so contributes a great deal to the improvement in recording quality, thereby accomplishing the previously mentioned second object of the present invention.

Figure 11:
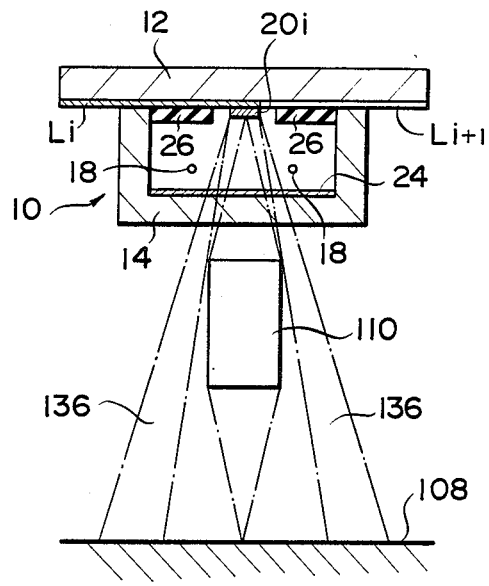
FIG. 11 is a vertical section illustrative of flare light from a dot array fluorescent tube.

Another embodiment of the dot array fluorescent tube in accordance with the present invention will be described. Where the fluorescent tube 10 shown in FIG. 2 is used to project light issuing from the fluorescent elements $20_i$ through the light transmitter array 110 onto the photoconductive element 108, the light transmitted through the face glass 14 is partly directed to the outside of the light transmitter array 110 as shown in FIG. 11. Such flare light, designated 136, is apt to effect the image formed on the photoconductive element 108 by the rest of the light propagated through the array 110.

Figure 12:
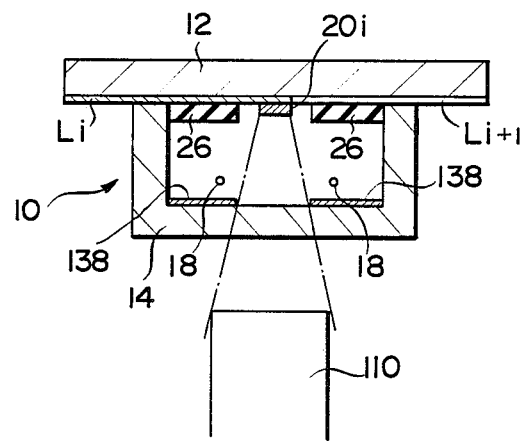
FIG. 12 is a vertically sectioned, side elevation of a dot array fluorescent tube in accordance with the present invention which is constructed to remove the flare light shown in FIG. 11.

The alternative embodiment as shown in FIG. 12, includes a conductive light intercepting film 138 which is removed by etching or the like in a slot form in alignment with the array of the fluorescent elements $20_i$. While an ordinary fluorescent tube for display applications needs be provided with a transparent face glass to enable a display to be seen from the front, it is needless for a dot array fluorescent tube to have an entirely transparent face glass 14, that is, only a narrow slot-like surface should be transparent for radiation. Since the face glass 14 is entirely covered with the light intercepting film 138 except for the slot area for radiation, the flare component 136 is eliminated. This particular embodiment, due to the conductivity of the flim 138, does not require the transparent electrode 24 for charge-up prevention. In the manner described, the embodiment shown in FIG. 12 accomplishes the third object of the present invention.

Figure 13:
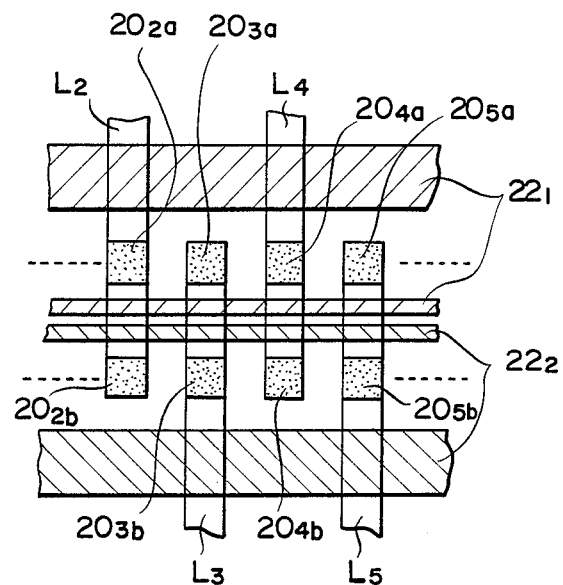
FIG. 13 is a plan view of another embodiment of the present invention.
Figure 14:
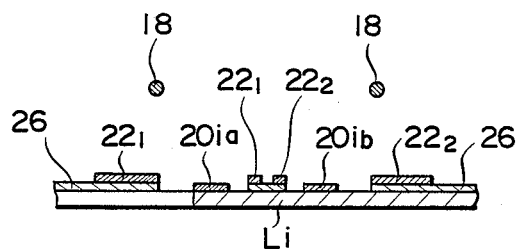
FIG. 14 is a vertically sectioned, side elevation of the embodiment of FIG. 13.

Referring to FIGS. 13 and 14, another embodiment of the present invention is shown. In this embodiment, each of the anode lead terminals $L_i$ carries thereon a plurality of fluorescent elements $20_i$, two elements $20_{ia}$ and $10_{ib}$ in the embodiment, so as to form two different dot arrays. Grids $22_1$ and $22_2$ which are controllable independently of each other are located in correspondence with the two dot arrays, respectively. Usually, to activate a dot array (fluorescent elements), a positive voltage is applied to an anode while a grid is held at a positive potential lower than that of the anode. In this instance, a filament is controlled to zero potential. If the grid is negative or zero potential, electrons liberated from the filament will not enter the fluorescent elements even through the anode may be at positive potential, preventing the elements from being stimulated.

With this in mind, the embodiment shown in FIGS. 13 and 14 is constructed such that where only the dot array $20_{ia}$ made up of the elements $20_{ia}$ is used, only the grid $22_1$ is at positive potential and the grid $22_2$ is at negative or at zero potential. As the dot array formed by the elements $20_{ia}$ becomes deteriorated due to aging, only the grid $22_1$ will be at positive potential to cause the other dot array formed by the elements $20_{ib}$ to emit light, thereby substantially compensating for the deterioration of the first-mentioned dot array. Since each anode lead terminal $L_i$ is shared by the fluorescent elements $20_{ia}$ and $20_{ib}$, replacement of external parts such as driving IC chips is needless and what is required is merely changing the voltage applied to the grids $22_1$ and $22_2$ by means of a switch. In this manner, the embodiment shown in FIGS. 13 and 14 accomplishes the fourth object of the present invention.

Figure 15:
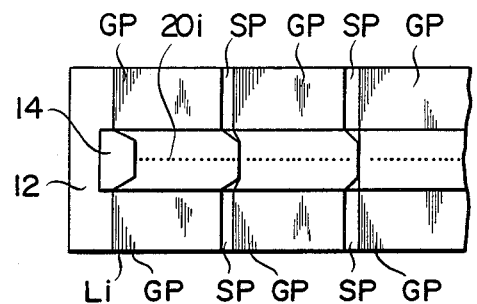
Figure 16:
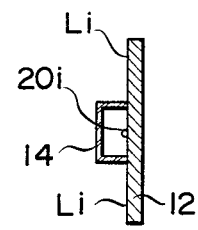
Figure 17:
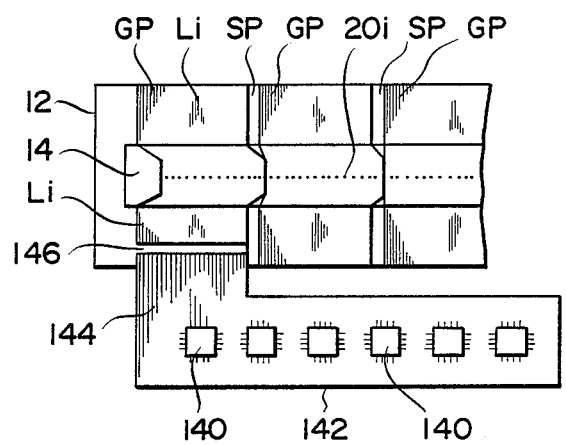

Another embodiment of the present invention will be described hereinafter. First, a basic construction adjacent to the glass substrate 12 will be described with reference to FIGS. 15 and 16. The anode lead terminals $L_i$ alternately led out to the right and left as shown in FIG. 3 are divided into a plurality of groups GP at each side. The nearby groups GP at each side neighbor each other at a spacing SP which is on the order of 1–2 millimeters. Where such terminals $L_i$ in groups GP are connected to the electrodes on the IC side of an IC substrate group by group, a pitch error can be absorbed. Specifically, as schematically shown in FIG. 17, electrodes 144 associated with IC chips 140 on an IC substrate 142 are connected to their associated groups of anode lead terminals $L_i$ at a connecting portion 146.

As shown in FIGS. 18 and 19, connection of the terminals $L_i$ on the substrate 112 and the electrode 144 on the IC substrate 142 is accomplished by fastening retainer plates 152 and 154 to each other by screws 156 with an anisotropic conductive rubber connector 150. As shown in FIG. 19, the anisotropic conductive rubber connector 150 comprises conductive elements 160 arranged in a mass of insulative rubber 158 in a predetermined direction and at predetermined pitches. The terminals $L_i$ and 144 can be readily and surely interconnected merely by compressing the connector 150 therebetween. The connector 150 of the kind described, which has found applications such as to liquid crystal display panels, is capable of interconnecting terminals at pitches up to 200 microns. Therefore, it is sufficiently applicable even to an optical printer if, in the case of a ten terminals per millimeter arranement, for example, the lead terminals $L_i$ are distributed in the alternating manner as shown in FIG. 3, i.e., at pitches of 200 microns. The IC substrate 142 may be made of a flexible material such as polyimide in order to arrange the IC chips 140 on the back of the substrate 12 and, thereby, render the whole configuration compact. Furthermore, in accordance with this embodiment, the substrate 12 even if made of glass will be prevented from being broken in contrast to the case of thermocompression bonding and, in addition, when any of the fluorescent elements $20_i$ or the like on the substrate 12 has failed, it is needless to replace the comparatively expensive ICs 140 and only the substrate 12 should be replaced. As described above, this particular embodiment accomplishes the fifth object of the present invention.

Various modifications will become apparent to those skilled in the art from the teachings of the present disclosure without departing from the scope thereof.

What is claimed is:

1. A frontview type dot array fluorescent tube for writing optical information which converts an information signal representative of an image to be recorded to optical information, comprising:
   (a) a housing comprising a substrate and a face glass spaced from each other and enclosing between them an elongate vacuum space, said face glass having a transparent portion extending in a lengthwise direction of said housing;
   (b) cathode means extending in the lengthwise direction in said vacuum space between the substrate and the face glass;
   (c) anode means arranged in an array at a predetermined spacing in the lengthwise direction of the substrate and in a position to face the transparent portion of the face glass;
   (d) fluorescent means provided on said respective anode means in an array to face the transparent portion of the face glass; and
   (e) grid electrode means extending in the length-wise direction between the cathode means and said array of said fluorescent means, said grid electrode means comprising a pair of elongate opaque strips defining between them an elongate slit aligned with the array of fluorescent means and the transparent portion of the face glass;
   including an insulating layer which is formed on selected portions of the substrate and faces the face glass, wherein the grid electrode means comprises a metal film formed on said insulating layer.

2. A dot array fluorescent tube as claimed in claim 1, further comprising a conductive light intercepting film covering the transparent portion of the housing except for a predetermined area which is where the transparent portion faces the array of the fluorescent means.

3. A dot array fluorescent tube as claimed in claim 1, wherein the array of the fluorescent means comprises a plurality of dot arrays spaced from each other along the anode means.

4. A dot array fluorescent tube as claimed in claim 3, including circuit means for controlling the dot arrays independently of each other.

5. A dot array fluorescent tube as claimed in claim 1, including external drive devices for the anode means, wherein the drive devices are divided into groups and the anode means comprises a plurality of lead terminals which are connected to respective anodes and extend to the outside of the housing and connect to respective drive devices, wherein the leads are divided into groups each of which comprises a predetermined number of leads and is connected to a respective group of the external drive devices.

6. A frontview type dot array fluorescent tube comprising:
   (a) a housing comprising a substrate and a face glass spaced from each other to enclose a vacuum space between them, said face glass being transparent over at least a selected portion thereof;
   (b) a cathode extending in said vacuum space between the substrate and the face glass;
   (c) anode means on the substrate, facing the transparent portion of the face glass;
   (d) fluorescent means provided on said respective anode means in the form of a dot array to face the transparent portion of the face glass; and
   (e) grid electrode means extending in the length-wise direction between the cathode and the dot array and comprising an opaque portion defining a slit aligned with the dot array of fluorescent means and the transparent portion of the face glass;
   including a light intercepting film formed on the face glass except for a portion thereof aligned with said dot array;

in which the light intercepting film is electrically conductive; and in which said opaque portion of the grid electrode means is in the form of an elongate plate with an elongate central opening defining said slit and said grid electrode means further comprises a mesh portion flanking said elongate plate.

7. A frontview type dot array fluorescent tube as in claim 6 in which said slit aligned with the dot array extends over a length which is greater than the length of said dot array.

8. A frontview type dot array fluorescent tube as in claim 7 in which the width of said slit aligned with the dot array is about 150 microns.

9. A frontview type dot array fluorescent tube comprising:
  (a) a housing comprising a substrate and a face glass spaced from each other to enclose a vacuum space between them, said face glass being transparent over at least a selected portion thereof.
  (b) a cathode extending in said vacuum space between the substrate and the face glass;
  (c) anode means on the substrate, facing the transparent portion of the face glass;
  (d) fluorescent means provided on said respective anode means in the form of a dot array to face the transparent portion of the face glass; and
  (e) grid electrode means extending in the length-wise direction between the cathode and the dot array and comprising an opaque portion defining a slit aligned with the dot array of fluorescent means and the transparent portion of the face glass;

in which said opaque portion of the grid electrode means is in the form of an elongate plate with an elongate central opening defining said slit and said grid electrode means further comprise a mesh portion flanking said elongate plate.

10. A frontview type dot array fluorescent tube as in claim 9 in which said slit extends over a length which is greater than the length of said dot array.

11. A frontview type dot array fluorescent tube as in claim 9 in which the width of said slit is about 150 microns.

* * * * *